United States Patent [19]

Fagan, Jr. et al.

[11] Patent Number: 5,523,284

[45] Date of Patent: Jun. 4, 1996

[54] PROCESS FOR PREPARING A BULK TEXTURED SUPERCONDUCTIVE MATERIAL

[75] Inventors: James G. Fagan, Jr., West Henrietta; Vasantha R. W. Amarakoon, Alfred, both of N.Y.

[73] Assignee: Alfred University, Alfred, N.Y.

[21] Appl. No.: 315,589

[22] Filed: Sep. 30, 1994

Related U.S. Application Data

[63] Continuation of Ser. No. 972,269, Nov. 5, 1992, abandoned.

[51] Int. Cl.$^6$ .................. H01L 39/24; H01L 39/12; H01B 12/00; C04B 35/45

[52] U.S. Cl. .................. 505/501; 505/785; 505/500; 505/120; 505/121; 505/125; 505/126; 505/235; 505/237; 505/238; 505/239; 505/440; 505/741; 505/742; 505/776; 505/777; 505/778; 505/779; 505/780; 505/782; 505/783; 505/784; 252/518; 252/520; 252/521; 501/123; 427/62; 427/376.2

[58] Field of Search .................. 505/501, 785, 505/733, 500, 120, 121, 125, 126, 235, 237, 238, 239, 440, 450, 451, 480, 432, 420, 430, 741, 742, 776, 777, 778, 779, 780, 782, 783, 784; 252/518, 520, 521; 501/123; 427/62, 375, 376.1, 376.2, 419.2, 419.3; 174/125.1

[56] References Cited

U.S. PATENT DOCUMENTS

| | | | |
|---|---|---|---|
| 4,988,673 | 1/1991 | Ferrando | 505/785 X |
| 5,071,826 | 12/1991 | Anderson et al. | 505/785 X |
| 5,126,321 | 6/1992 | Hinks et al. | 505/733 X |
| 5,200,389 | 4/1993 | Tachikawa et al. | 505/733 X |
| 5,206,213 | 4/1993 | Cuomo et al. | 505/733 X |
| 5,217,943 | 6/1993 | Hermann et al. | 505/733 X |
| 5,248,660 | 9/1993 | Lee et al. | 505/742 X |

FOREIGN PATENT DOCUMENTS 3-257018  11/1991  Japan ..................... 505/733

OTHER PUBLICATIONS

Schmirgeld, L., et al., "Interdiffusion between YBCO and Bi–Based $T_c$ superconducting ceramics", *Cryogenics*, 32(11) (1992), 1000–1004 (Paper presented during 22–24 Apr. 1992 conference).

Tachikawa, Kyoji, et al., "Bi–Sr–Ca–Cu–O superconducting Oxides Synthesized from Different Diffusion Couples", *Japanese Journal of Applied Physics*, 30(4) (Apr. 1991), 639–644.

Tachikawa, K., et al., "Synthesis of Bi–base high–$T_c$ oxides through a diffusion reaction", *Superconductor Science & Technology*, 3(4) (Apr. 1990), 180–184.

Chemical Abstracts, accession No. 110:32253, Tachikawa, Kyoji, et al., "Fabrication of superconducting yttrium barium copper oxide through an improved diffusion process", *Jpn. J. Appl. Phys.*, Part 2, 27(8) (1988), L1501–L1503.

Chemical Abstracts, accession No. 109:140380, Tachikawa, K., et al., "Preparation of yttrium barium copper oxide superconducting composite tapes by a diffusion process", *Mater. Res. Soc. Symp. Proc.* (1988), 99 (High–Temp. Supercond.), 727–730.

*Primary Examiner*—Paul Lieberman
*Assistant Examiner*—Douglas J. McGinty
*Attorney, Agent, or Firm*—Howard J. Greenwald

[57] ABSTRACT

In accordance this invention, there is provided a process for making a bulk superconductive material. In the first step of this process, a diffusion couple is formed from superconductor oxide and impurity oxide. Thereafter, the diffusion couple is heated to a temperature in excess of 800 degrees Centigrade, cooled at a controlled rate, and annealed.

11 Claims, 5 Drawing Sheets

FIG.13 ature greater than about 35 degrees Kelvin and, preferably, greater than about 77 degrees Kelvin.

5,523,284

PROCESS FOR PREPARING A BULK TEXTURED SUPERCONDUCTIVE MATERIAL

This is a continuation of application Ser. No 07/972,269 filed Nov. 5, 1992 now abandoned.

FIELD OF THE INVENTION

A process for preparing a textured bulk superconductive material using a diffusion couple is disclosed.

BACKGROUND OF THE INVENTION

U.S. Pat. No. 5,011,823 of S. Jin et al. discloses a process for fabricating oxide superconductors by a melt growth method. In this process, a melt is produced from a precursor material which, preferably, is in the form of pressed superconductive oxide powder; the melt is thereafter cooled to form a body of the desired shape, which is then heat-treated.

The process of the Jin et al. patent allows one to make wires, ribbons, and rods by zone melting. However, this process is not readily suitable for making shaped articles which have a relatively large cross-sectional area and/or which have complex shapes.

Some of the disadvantages of the process of the Jin et al. patent are avoided by a process described in U.S. Pat. No. 4,956,336 of K. Salama et al. In the Salama et al. process, a solid state reaction product is compacted and then sintered at a temperature of from about 40 to about 90 degrees Centigrade below its melting point. Thereafter, the product is slowly cooled over a period of a least about 12 hours.

It is an object of this invention to provide a process for producing a bulk superconductive object which has a critical current of at least about 2,000 amperes per square centimeter at 77 degrees Kelvin when subjected a magnetic field of 1 Tesla and which displays flux pinning behavior.

It is another object of this invention to provide a process for preparing a bulk superconductive object with a relatively large cross-sectional area and/or a relatively complex shape.

It is yet another object of this invention to provide a shaped body which may be used to produce a bulk superconductive material.

It is yet another object of this invention to provide a an economical process for making the bulk superconductive material which does not necessarily require a heat treatment for a period of at least 12 hours.

It is yet another object of this invention to provide a shaped object consisting essentially of the textured superconductive material of this invention.

SUMMARY OF THE INVENTION

In accordance this invention, there is provided a process for making a bulk superconductive material. In the first step of this process, a diffusion couple is formed from superconductor oxide and impurity oxide. Thereafter, the diffusion couple is heated to a temperature in excess of 800 degrees Centigrade, cooled at a controlled rate, and annealed.

BRIEF DESCRIPTION OF THE DRAWINGS

The invention will be described by reference to the enclosed drawings, in which like elements are referred to by like numerals, and in which.

DESCRIPTION OF THE REFERRED EMBODIMENTS

The textured material produced by the process of this invention preferably is comprised of at least about 50 weight percent of a "high Tc" oxide superconductive material and, more preferably, contains at least about 70 weight percent of such superconductive material; in one preferred embodiment, the textured material consists essentially of such superconductive material.

As used in this specification, the term "high Tc" refers to a superconductive material which has a critical temperature greater than about 35 degrees Kelvin and, preferably, greater than about 77 degrees Kelvin.

These "high Tc" superconductors, and the reagents needed to prepare them, are well known to those skilled in the art. Thus, e.g., reference may be had to an article by A. W. Sleight entitled "Chemistry of High-Temperature Superconductors," Science, Volume 242 (Dec. 16, 1988) at pages 1519–1527.

One preferred class of superconductors, described on pages 1522–1523 of the Sleight article, may be described by the formulae $(R_{1-z}M_z)(Ba_{2-y}M'_y)Cu_3O_{6+x}$, and $(R_{1-z}M_z)(Ba_{2-y}M'_y)Cu_4O_8$, wherein x is from about 0.5 to 1.0 and R is a rare earth element such as a lanthanide selected from the group consisting of yttrium, gadolinium, lanthanum, praseodymium, lutetium, thulium, europium, holmium, mixtures thereof, and the like, and M and M' are independently selected from the group consisting of barium, strontium, calcium, and an lanthanide element, and mixtures thereof, z is from about 0 to about 0.5, and y is from about 0 to about 0.4. See, e.g.., U.S. Pat. Nos. 5,120,703, 4,960,760, 4,951, 028, and 4,971,946 for a description of these type of superconductive materials; the disclosure of each of these patents is hereby incorporated by reference into this specification.

By way of illustration and not limitation, some of the compositions which advantageously may be made by applicants' process include $YBa_2Cu_3O_{6+x}$, $(Y_{1-z}[Ln]_z)Ba_2Cu_3O_{6+x}$ (wherein Ln is a lanthanide metal selected from the group consisting of lanthanum, praeseodymium, neodymium, samarium, europium, gadolinium, terbium, dysprosium, holmium, erbium, and the like), $(y_{1-z}[Ca]_z)Ba_2Cu_3O_{6+x}$, $(Y_{1-z}[Sr]_z)Ba_2Cu_3O_{6+x}$, $YBa_{2l}Cu_4O_8$.

In another embodiment, superconducting materials of the bismuth and thallium systems are used. These materials are disclosed in an article by David P. Matheis and Robert L. Snyder entitled "The Crystal Structures and Powder Diffraction Patterns of the Bismuth and Thallium Ruddlesden-Popper copper Oxide Superconductors, Powder Diffraction, Volume 5, No. 1. 8–25, Mar. 1990.

In one preferred embodiment, the superconductor produced by the process of this invention is of the formula $(AO)_m M_2Ca_{n-1}Cu_nO_{2n+2}$, wherein (1)A is selected from the group consisting of thallium, bismuth, mixtures of thallium and lead, and mixtures of bismuth and lead, (2)m is from about 1 to about 3, (3)M is selected from the group consisting of barium, strontium, and mixtures thereof, and (4) n is at least 1. These superconductors are well known to those skilled in the art.

In one preferred embodiment, A is bismuth, m is 2, M is strontium, and n is 2. This is the well known 2,2,1,2 bismuth superconductor material.

In another preferred embodiment, A can be a mixture of bismuth and lead, and is represented by the formula $Bi_{2-x}Pb_x$, wherein x is from about 0.0 to 0.5. Thus, the well known 2,2,2,3 bismuth and bismuth-lead superconductors are represented by this formula.

In another preferred embodiment, A is bismuth, m is 2, M is strontium, and n is 1. This is the well known 2,2,0,1 bismuth superconductor.

In another preferred embodiment, A is bismuth, m is 2, M is strontium, and n is 3. The is the well known 2,2,3,4 phase In another preferred embodiment, A is thallium, m is 1, M is barium, and n is 1. This is the 1,2,0,1 thallium superconductor. In other embodiments, n may be 2 (the 1,2,1,2 phase), 3 (the 1,2,2,3 phase), or 4 (the 1,2,3,4 phase).

In another preferred embodiment, A is thallium, m is 2, M is barium, and n may be 1 (the 2,2,0,1 phase), or 2 (the 2,2,1,2 phase), 3 (the 2,2,2,3 phase), or 4 (the n 2,2,3,4 phase).

The aforementioned description of specified superconductive materials is only illustrative, and those skilled in the art will appreciate that applicants' process may be used with substantially any ceramic superconductive material. The superconductive material produced by the process of this invention has specified critical current values. As is known to those skilled in the art, the critical current of a superconductive material is the current above which the material is normal and below which the material is superconducting, at a specified temperature and a specified magnetic field.

When the superconductive material of this invention is measured at 77 degrees Kelvin at a magnetic field of 10 Gauss, then the critical current of such material is at least about 10,000 amperes per square centimeter; this critical current value is preferably measured by a surface impedance technique, which is described below.

The surface impedance technique, which is also often referred to as an inductive technique, is well known to those skilled in the art and is described, e.g., in publications such as: (1)L. M. Fisher et al., "Effect of microstructure on the magnetic-field dependence of the local critical current density in . . . superconductors, Physical Review B, Volume 46, Nov. 1, 1992, (2)L. M. Fisher et al., Solid State Communications 76, 141(1990), (3)L. M. Fisher et al., "The Universal Magnetic Field Dependence of the Critical Current Density in High-Tc Ceramics," AIP Conference Proceedings 251: Superconductivity and its Applications (American Institute of Physics, New York, New York, 1992), at pages 625–636; and (4) "Concise Encyclopedia of Magnetic & Superconducting Materials, edited by J. Evetts (Pergamon Press, New York, N.Y., 1992), at pages 310–314.

Additionally, or alternatively, the transport current (which is also measured by the impedance technique described above) may be measured by a resistive technique utilizing the four-point probe method which is described, e.g., by E. C. Behrman et al. in an article entitled "Synthesis, Characterization, and Fabrication of High-Temperature Superconducting Oxides," Advanced Ceramic Materials, Volume 2, No. 3B, page 539, July, 1987. Reference also may be had to U.S. Pat. No. 4,973,574 of Nishio et al., the disclosure of which is hereby incorporated by reference into this specification.

When the superconductive material of this invention is measured at 77 degrees Kelvin at 100 Gauss, its critical current is preferably at least about 100,000 amperes per square centimeter. As is known to those skilled in the art, when the properties under which the critical current is measured are varied from ambient (which is about 10 Gauss), the critical current of the superconductive material may be measured by the well-known hysteresis magnetization technique using a superconductive quantum interference device ("SQUID"). This magnetization technique is described, e.g., in: (1) the aforementioned "Concise Encyclopedia of Magnetic & Superconducting Materials, edited by J. Evetts (Pergamon Press, New York, New York, 1992), at pages 95–101 and 310–314, (2) an article by C. P. Bean entitled "Magnetization of hard superconductors," Physical Review Letters 8:250–3 (1962), and (3)C. P. Poole, Jr. et al., "Copper Oxide Superconductors" (John Wiley and Sons, New York, N.Y., 1988), at pages 199–204.

When the superconductive material of this invention is measured at 77 degrees Kelvin at a magnetic field of 10 Gauss by the surface impedance technique, it is preferred that its critical current be at least 20,000 amperes per square centimeter. It is even more preferred that this critical current be at least 30,000 amperes per square centimeter. In an even more preferred embodiment, the critical current measured under these conditions is at least about 40,000 amperes per square centimeter.

When the superconductive material of this invention is measured at 77 degrees Kelvin at a magnetic field of 100 Gauss by the hysteresis magnetization technique, is preferred that its critical current be at least about 500,000 amperes per square centimeter. In a more preferred embodiment, such critical current is at least about 800,000 amperes per square centimeter.

When the superconductive material of this invention is measured at 77 degrees Kelvin at a magnetic field of 10,000 Gauss, its critical current is at least about 35,000 amperes. per square centimeter. It is preferred that, under these conditions, the critical current be at least about 100,000 amperes per square centimeter.

The superconductive material of this invention exhibits an enhanced pinning effect. As is known to those skilled in the art, the stability of magnets levitated above superconductors depends on several factors such as flux penetration and the pinning effect. See, e.g., an article by L. C. Davis et al. entitled "Stability of magnets levitated above superconductors," Journal of Applied Physics, 64(8), Oct. 15, 1988. As is disclosed in U.S. Pat. No. 4,960,760, the pinning force exerted by the magnetized object may be estimated by the formula appearing at page 4212 of the Davis article.

Figure 1:
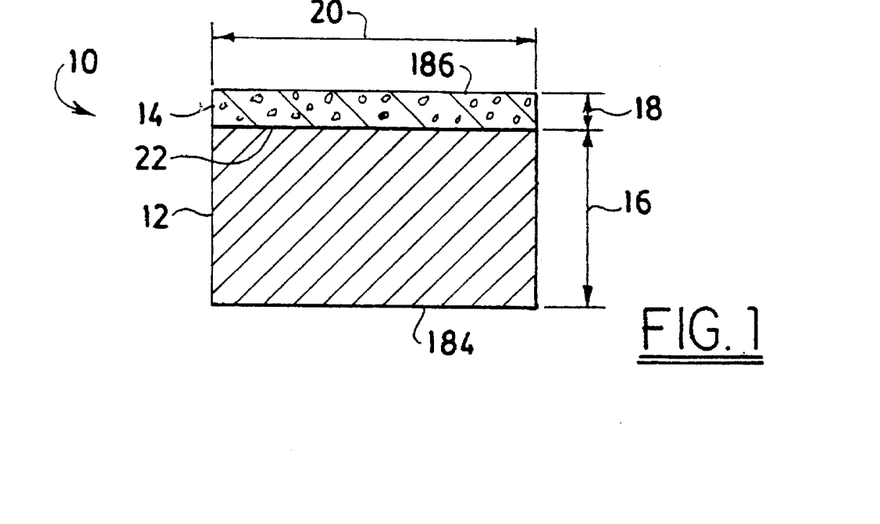
FIG. 1 is a sectional view of one preferred intermediate used in the process of applicants' invention.

In one embodiment, the pinning effect of the superconductive material of this invention is enhanced by the addition of from about 0.5 to about 20 weight percent of one or more pinning agents to the composition of layer 12. It is generally preferred to add from about 1 to about 5 weight percent of such pinning agent(s).

The identity of such pinning agents is well known se skilled in the art. Thus, by way of illustration, one may incorporate into the superconductive layer 12 an effective amount of agents such as, e.g., silver, platinum, $Y_2BaCuO_5$, silicon oxide, titanium oxide, barium titanate, lead titanate, the flux pinning agents described in U.S. Pat. No. 4,264,358 (the disclosure of which is hereby incorporated by reference into this specification), and the like.

In one preferred embodiment, the superconductive material consists essentially of a "Type II" superconductor. As is known to those skilled in the art, "Type II" superconductors are characterized by first and second values of critical field, $H_{c,1}$ and $H_{c,2}$, in which field penetration first occurs at the lowest value to result in pinned fields which persist to much higher $H_{c,2}$ levels. See, e.g., U.S. Pat. No. 4,960,760 of Wang and U.S. Pat. No. 4,797,386 of Gygorgy et al., the disclosures of which are hereby incorporated by reference into this specification.

The superconductive materials of this invention allow the penetration of a magnetic field while retaining superconductivity if the magnetic field is neither too strong nor too weak. Thus, such superconductive materials may be used in magnetic bearings, such as a magnetic quadrapole bearing, flux pinning bearing, a hybrid superconductor magnet bearing, and the like. Thus, such superconductive materials may be used as a magnetic torque coupler, a vibration damper, and the like. These and other applications are discussed in an article by W. K. Chu entitled "Applications of High Temperature Superconductors on Levitation Bearings and Other Levitation Devices," which was given at the Proceedings of the World Congress on Superconductivity in Munich, Germany on Sep. 15–18, 1992.

The superconductive material of this invention also exhibits a stable suspension property. When the superconductor is disposed below a permanent magnet and the flux of the magnet is pinned within the superconductor, it will remain stably suspended. This property has been described in the art in, e.g., (1)an article by P. N. Peters et al. appearing in Applied Physics Letters 52 (1988) 2066, and (2) an article by Y. Shapira et al. entitled "Magnetization and Magnetic Suspension of . . . Superconductors," appearing in the Journal of Magnetism and Magnetic Materials 78 (1989) at pages 19–30.

Intermediates Used In One Process Of The Invention

FIG. 1 is a sectional view of an intermediate 10 used in one preferred process of the invention. Referring to FIG. 1, it will be seen that intermediate 10 is comprised of superconductive layer 12 and, integrally bonded to it, metal oxide layer 14.

Referring again to FIG. 1, it will be seen that the thickness 16 of superconductive layer 12 is at least about 3.0 times as great as the thickness 18 of oxide layer 14. It is preferred that thickness 16 be at least about 10.0 times as great as thickness 18.

It is preferred that the length 20 of the oxide layer 14 be at least about 0.95 times as great as the length of the top surface 22 of superconductive layer 12. It is more preferred that length 20 be at least about 0.99 times as great as the length of top surface 22 so that it covers substantially all of such top surface.

The superconductive layer 12 preferably consists essentially of Type II superconductive material. As used in this specification, the term "Type II superconductive material" refers to both the actual sintered superconductor material, a powder mixture with the stoichiometry required to produce the superconductor material after heat treatment, a glass melt with the stoichiometry required to produce the superconductor material after remelting and heat treatment, and mixtures thereof.

By way of illustration and not limitation, and with reference to the well-known 1:2:3 yttrium:barium:copper oxide superconductor, one may use any of the following materials in layer 12: (1) a powder mixture containing 1 mole of yttrium oxide (or a material, which upon heating, will produce 1 mole of yttrium oxide, like yttrium carbonate), 2 moles of barium oxide (or a material which will produce 2 moles of barium oxide upon heating, such as barium carbonate), and 3 moles of copper oxide or copper oxide precursor), (2)a glass material which contains the oxides (or precursors thereof) of yttrium, barium, and copper in the 1:2:3 stoichiometric ratio, (3)the 1:2:3 superconductive material, preferably in crystalline powder form, and/or (4)mixtures of one or more of the aforementioned in ratios chosen that, after heating, the desired amount of the 1:2:3 superconductor material will be produced.

In one preferred embodiment, which is especially useful with the aforementioned 1:2:3 superconductor material, the superconductor layer 12 is comprised of at least 70 weight percent of glass which preferably consists essentially of the superconductive phase such as, e.g., the yttrium, barium, and copper in the 1:2:3 molar ratio. In this embodiment, up to about 30 weight percent of the layer 12 may be comprised of yttrium oxide particulate matter which, preferably, has a particle size such substantially all of such particles are smaller than 10 microns. Alternatively, or additionally, other materials may be present such as, e.g., the aforementioned flux pinning agent(s).

It is preferred, in this embodiment, that at least 95 weight percent of the layer 12 be comprised of such glass and no more than 5 weight percent be comprised of such yttrium oxide particulate matter.

In any event, in one preferred embodiment, and regardless of the mixture of glass and non-glass phases in the layer 12, the total stoichiometry is preferably such that, when the material is processed in accordance with applicants' method, the layer 12 is transformed so that at least about 50 weight percent of the layer 12 is comprised of the superconductive phase, such as the aforementioned 1:2:3 phase. It is preferred that, in the final product, at least about 70 weight percent of the product be comprised of the superconductive layer 12.

In one preferred embodiment, wherein the layer 12 is comprised of at least about 70 weight percent of glass with the required stoichiometry, the layer 12 is preferably prepared by a specified melting procedure in which the powder is melted by heating to a temperature in excess of 1200 degrees Centigrade and subjecting it to such temperature until substantially complete melting has occurred, and the melt is thereafter quenched. This type of procedure is described, e.g., by M. Muarakami in an article entitled "Melt Processing of . . . Superconductors," Modern Physics Letters B, Volume 4, No. 3 (1990), 163–179.

As will be apparent to those skilled in the art, the layer 12 may be formed into any desired shape by conventional forming procedures. Thus, by way of illustration and not limitation, one may form such layer 12 by means such as tape casting, slip casting, hot isostatic pressing, extrusion, hot forging, extrusion, gel casting, and the like.

Referring again to FIG. 1, it will be seen that oxide layer 14 is integrally joined to layer 12. Conventional means may be used to integrally join layers 14 and 12.

In one embodiment, either a slurry of the oxide material or a powder compact is pressed together with the superconductor material layer 12 by conventional pressing means. Thus, e.g., one may use a hydraulic press with a pressure of from about 100 to about 180 megaPascals.

In another embodiment, the oxide material, in aerosol form, is sprayed onto the layer 12 and allowed to dry.

In yet another embodiment, the oxide material, in either glass or crystalline form, or a mixture thereof, is applied to layer 12 by tape casting.

In yet another embodiment, the oxide material is coated as a film onto the layer 12 by conventional means such as, for example, chemical vapor deposition, plasma vapor deposition, evaporation, thermal spraying, and the like. See, e.g., Metals Handbook, Volume 5, "Surface Cleaning, Finishing, and Coating" (American Society of Metals, Metals Park, Ohio, 1982).

The oxide layer 14 is preferably comprised of at least about 50 weight percent of one or more elemental oxides; the preferred elemental oxides are metal oxides. The oxide(s) in layer 14 may be in crystalline form (such as in powder form), in glass form, or mixtures thereof. .

It is preferred that layer 14 contain at least about 90 weight percent of one or more oxides which, preferably, are metal oxides. In one embodiment, the layer 14 consists of metal oxide material.

By way of illustration and not limitation, one may use an oxide of an element of Group VB of the Periodic Table. Thus, e.g.,one may use bismuth oxide, antimony oxide, arsenic oxide, phosphorous pentoxide, and mixtures thereof. In this Group, the bismuth oxide is preferred, and it is advantageously used in its crystalline powder form. The powder may be applied directly (by,e.g., pressing), or it may first be combined with dispersion media (such as water, ethanol, other alcohols, organic solvents, and the like) and then either sprayed or coated onto the layer 12. It is preferred, when using the bismuth oxide in its powder form (or, for that matter, when using any of the other oxides), that the particle size distribution of the oxide material be such that substantially all of its particles are smaller than 100 microns and, more preferably, smaller than about 10 microns.

By way of further illustration, one may use silica as the oxide. In this embodiment, it is preferred to use silica in its crystalline form with a particle size of less than about 100 microns. Alternatively, one may form a glass from the silica, grind the glass so that substantially all of its particles are smaller than about 100 microns, and pressing the ground glass into contact with layer 12.

By way of further illustration, one may use copper oxide or silver oxide, either one of which may be used in either of its two valence states. In general, however, it is preferred that layer 14 comprise or consist of only one oxide material.

In one embodiment, a binary oxide may be used in layer 14. Thus, by way of illustration and not limitation, one may use barium cuprate, strontium cuprate, yttrium indium oxide, yttrium silicate, and the like. These and other binary oxides are well known to those skilled in the art. Binary compounds containing at least one or more elements of Group IIA of the Periodic Table are often used.

By way of further illustration, one may use an oxide of metal of Group VA of the Periodic Table. Thus, niobium oxide is advantageously used in its crystalline powder form. When niobium is used, either alone and/or in mixture with one or more other oxides, it is preferred that the particle size of the oxide material be less than about 10 microns.

By way of further illustration, one may use an oxide of a metal in the lanthanide series such as, e.g., an oxide of praseodymium, neodymium, samarium, europium, gadolinium, dysprosium, holmium, erbium, ytterbium, and the like.

By way of yet further illustration, one may use an oxide of an element of Group IIIB of the Periodic Table such as, e.g., boron oxide, indium oxide, thallium oxide, gallium oxide, alumina, and mixtures thereof.

One may also use one or more oxides from Group IIIA of the Periodic Table such as, e.g., yttrium oxide, lanthanum oxide, scandium oxide, and the like.

The oxides of titanium, zirconium, and hafnium also may be used.

Mixtures of one or more of the aforementioned oxides also may be used. Alternatively, or additionally, one may use the elemental forms of the oxides, such as, e.g., elemental silver, gold, bismuth, indium, copper, tin, antimony, and the like. Alternatively, or additionally, one may use the hydrated form of the oxides such as, e.g., lanthanum oxide.

In one preferred embodiment, not shown, layer 12 is contacted with one or more inorganic compounds in addition to, or instead of, the metal oxide material(s) described above. Thus, e.g., one may coat layer 12 with one or more salts such as, for example, the halides, sulfates, nitrates, phosphates, borates, silicates, and other compunds of potassium, sodium, lithium, cesium, barium, rubidium, strontium, calcium, magnesium, beryllium, lead, boron, aluminum, silicon, gallium, germanium, indium, mixtures thereof and the like.

The preferred inorganic compounds are selected from the group consisting of the halides of potassium, the halides of sodium, the halides of lithium, the halides of calcium, the halides of strontium, and the haldies of barium. In one emboidment, potassium chloride is the inorganic compound used.

It is preferred to apply a suffient amount of the additional inorganic compound so that, in combination with the aforementioned oxide material(s), the specified layer 14 is produced.

In one embodiment, the oxide/salt/metal layer 14 is comprised at least about 50 weight percent of either the oxide material and/or the salt material and/or the metal material and, additionally, from about 0.5 to about 50 weight percent of a synthetic polymeric material such as, e.g., polethylene, polyacrylate, polymethacrylate, polyimides, polyamides, polyesters, and the like.

Figure 2:
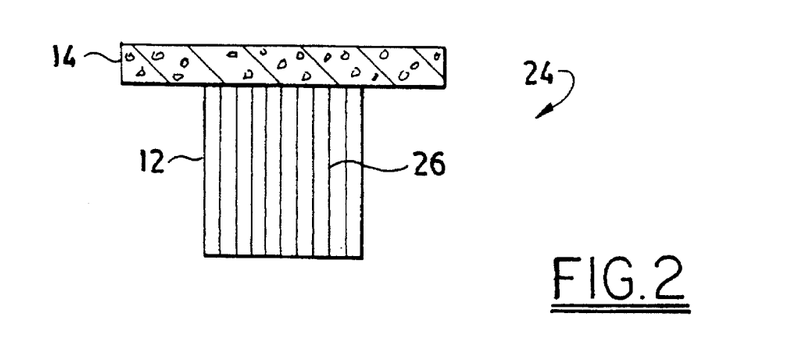
FIG. 2 is a sectional view of the intermediate of FIG. 1 after it has been heat treated.
Figure 4:
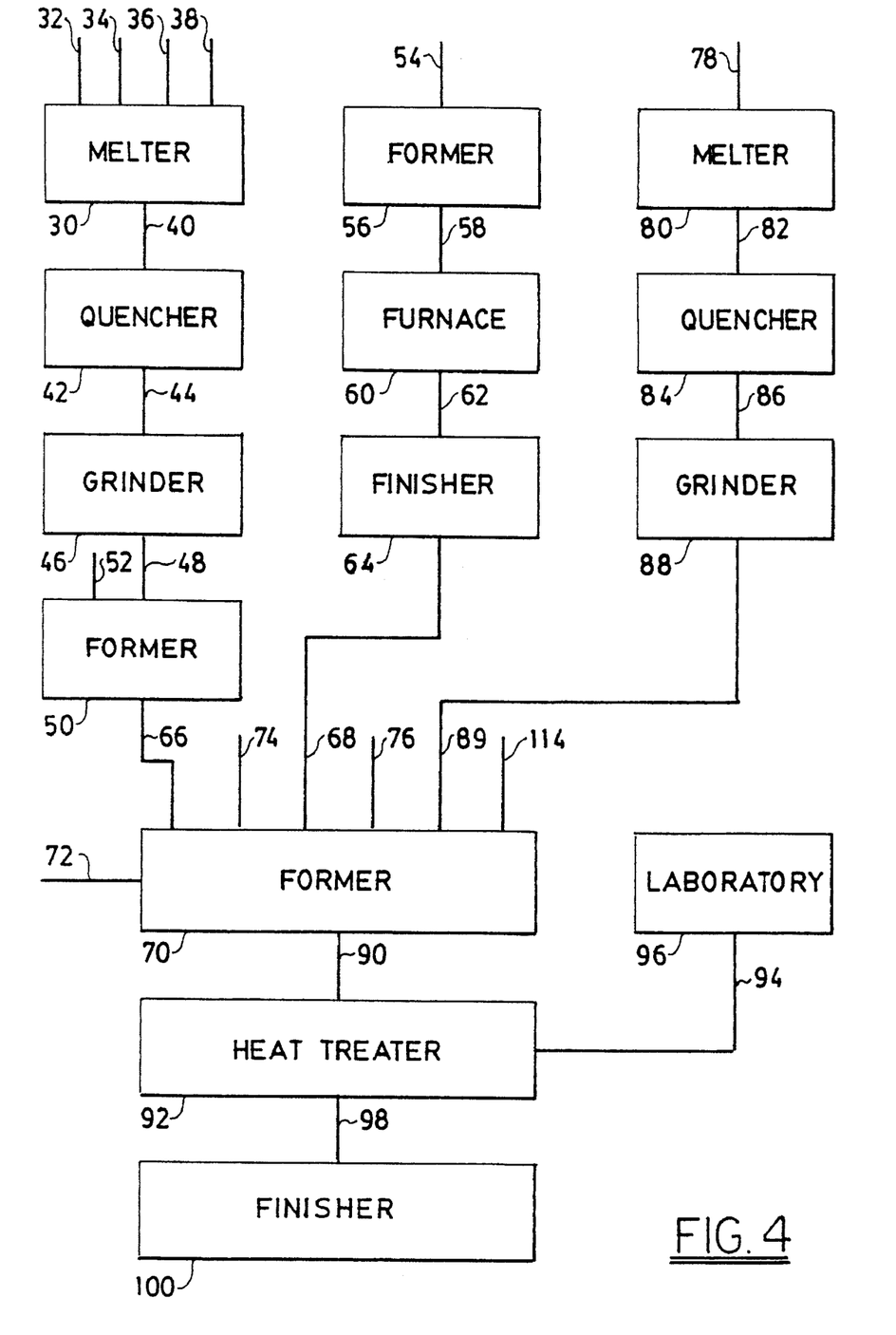
FIG. 4 is a flow diagram of one preferred embodiment of applicants' process.
Figure 5:
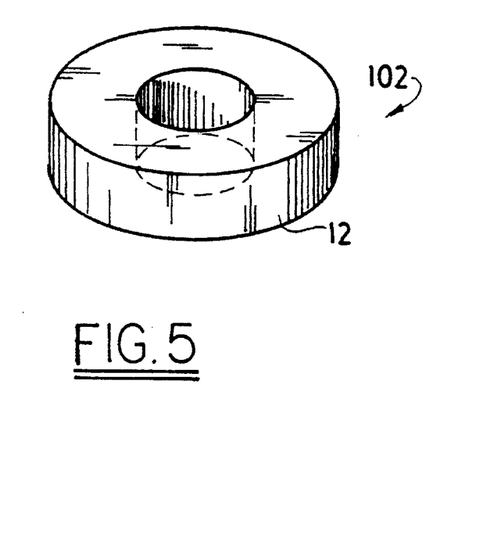
FIG. 5 illustrates a superconductive body in the shape of a toroid which may be made by the process of FIG. 4.
Figure 6:
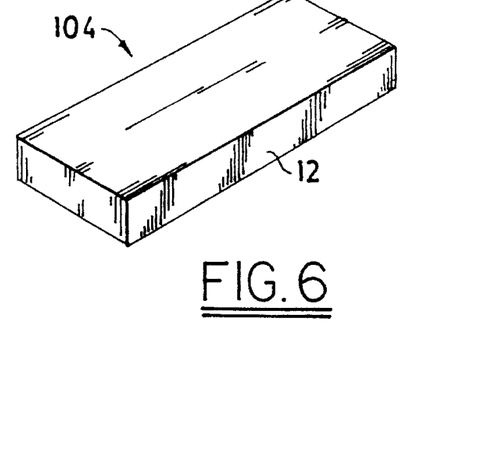
FIG. 6 illustrates a superconductive body in the shape of a bar which may be made by the process of FIG. 4.
Figures 7, 8:
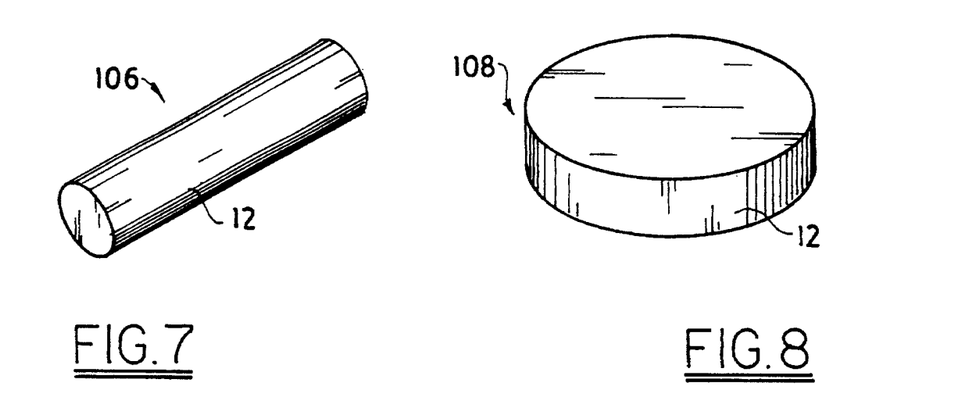
FIG. 7 illustrates a superconductive body in the shape of a rod which may be made by the process of FIG. 4.
FIG. 8 illustrates a superconductive body in the shape of a disc which may be made by the process of FIG. 4.
Figure 9:
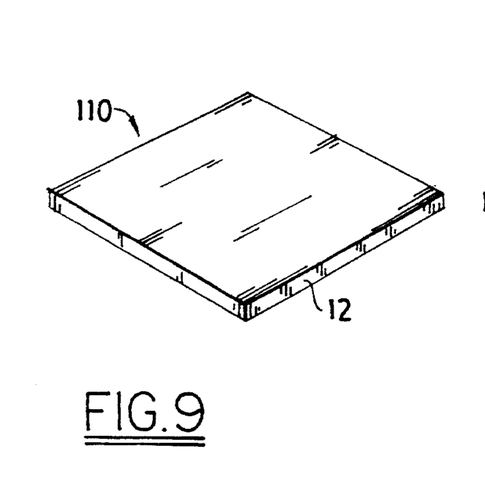
FIG. 9 illustrates a superconductive body in the shape of a plate which may be made by the process of FIG. 4.
Figure 10:
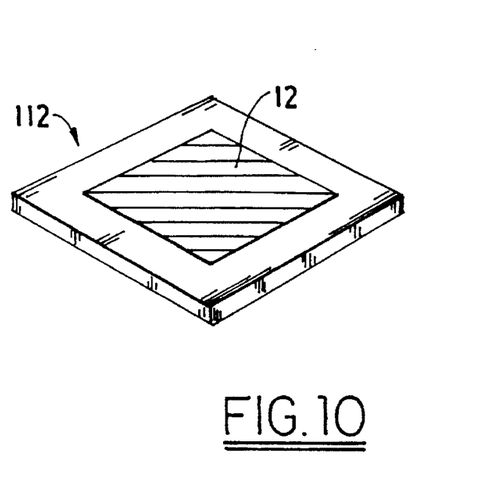
FIG. 10 illustrates a body comprised of a substrate and a thick film disposed on one surface thereof which may be made by the process of FIG. 4.

Referring again to FIG. 1, after intermediate 10 has been formed, it is then heat treated in accordance with the procedure illustrated in FIG. 4. Because the material in layer 12 has a shrinkage under the conditions of the process which normally exceeds the shrinkage of the material in layer 14, a pedestal-shaped structure 24 is produced. It will be noted that, in layer 12, aligned grains forming domains 26 are formed which, preferably, extend downwardly. Without wishing to be bound to any particular theory, applicants believe that the orientation of domains 26 is similar to the direction of the diffusion gradient. If conditions are altered so that the diffusion gradient is altered, it is believed that the orientation of domains 26 will also be correspondingly altered.

Figure 3:
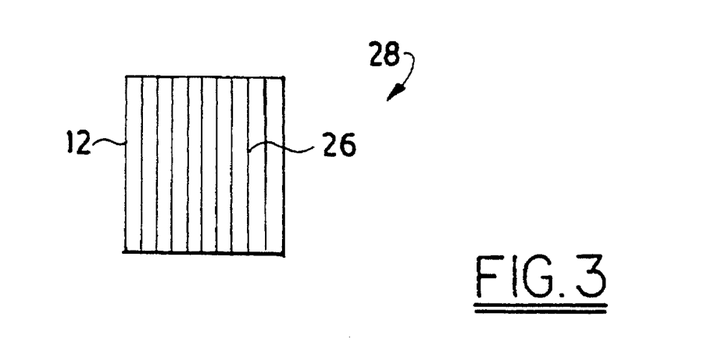
FIG. 3 is a sectional view of the intermediate of FIG. 2, after the top portion of it has been removed.

After the structure 24 has been formed, it may be finished to remove layer 14, thereby producing the structure 28 of FIG. 3.

In one embodiment, instead of removing layer 14, a laminated structure is produced by joining additional layers 12 and 14 onto the diffusion couple.

FIG. 4 illustrates one preferred embodiment of the process of applicants' invention. For the sake of simplicity, this embodiment will be illustrated with reference to the production of the 1:2:3 superconductor material. However, as will be apparent to those skilled in the art, the same process may be used to produce other superconductive materials.

Referring to FIG. 4, yttrium barium copper oxide powder, of the formula $YBa_2Cu_3O_x$ (wherein x is about 6.5) is charged to melter 30 via line 32. As is known to those skilled in the art, such powder can readily be made or, alternatively, purchased; thus, e.g. , it may be purchased (as catalog number 32,862-6) from the Aldrich Chemical Company, Inc. of 1001 West Saint Paul Avenue, Milwaukee, Wis. (see the 1990–1991 Aldrich catalog).

Alternatively, or additionally, one may charge yttrium oxide or a precursor thereof (such as yttrium carbonate), barium oxide (or a precursor thereof), and copper oxide (or a precursor thereof) via lines 34, 36, and 38. This method of preparing the 1:2:3 material is well known and is disclosed, e.g., in U.S. Pat. Nos. 5,015,622 (see Example 1), 4,960,760 (see Example 1), and the like. The disclosure of each of these patents is hereby incorporated by reference into this specification.

Regardless of the charge used, a melt is formed in melter 30 with a stoichiometry reflecting the composition of the desired 1:2:3 material. This melt is then passed via line 40 to quencher 42, wherein it is quenched to form glass by conventional means. Thus, in one embodiment, the melt is poured onto a cold copper plate. In another embodiment, the melt is quenched on cold metal rollers (such as copper rollers).

The glass formed in quencher 42 is then passed via line 44 to grinder 46, wherein it is ground so that substantially all of its particles are smaller than about 50 microns. Thereafter, the glass particles are passed via line 48 to former 50, wherein it is formed into a green body of the desried shape. In one embodiment, oxide material is charged via line 52 and simultaneously formed with the superconductive material to form the intermediate 10 (see FIG. 1).

Referring again to FIG. 1, and in another embodiment illustrated therein, the yttrium barium copper oxide powder may be charged via line 54 to former 56, wherein it may be shaped into a green body of the desired shape. The green body is then passed via line 58 to furnace 60, where it is sintered. It is preferred to sinter the green body by heating to a temperature of from about 800 to about 1,200 degrees Centigrade until the material has a density of at least about 50 percent of its theoretical density. It is preferred to sinter until the green body has a density of at least about 65 percent of its theoretical density.

The sintered body may then be passed via line 62 to finisher 64 wherein, optionally, any "skin" reaction layer formed upon the surface of the sintered body may be removed by grinding, sand blasting, or other conventional methods.

The formed layer 12 may be charged via either line 66 or 68 to former 70, where it may be joined with the oxide layer 14. Alternatively, a mixture of superconducting precursor materials may be charged via line 72.

The oxide material, which preferably is in the form a powder, may be charged via line 74 and joined with either the formed superconductive material body (from line 66 or line 68) or the superconductive precursor material (from line 72). Thus, e.g., the two layers of material may be pressed together with a Carver Laboratory Press, model M (manufactured by the Fred S. Carver Company of Menomonee Falls, Wis. Thus, e.g., the two layers of material may be joined by other conventional joining methods.

Alternatively, the oxide material may be charged to former 70 via line 76 in the form of a slurry, an aerosol, a thick film, etc. Those skilled in the art are aware of many different means by which two layers of material may be joined to each other; see, e.g., James S. Reed's "Introduction To The Principles of Ceramic Processing" (John Wiley and Sons, New York, 1988). Reference also may be had to "Sol Gel Technology for Thin Films, Fibers, Preforms, Electronics and Specialty Shapes," edited by Lisa Klein (Noyes Publications, Park Ridge, N.J., 1990).

In one embodiment, a glass is formed of the oxide material prior to the time it is joined to the superconductor material. Referring again to FIG. 4, oxide material (described elsewhere in this specification) is charged via line 78 to melter 80. It is preferred to use an oxide selected from the group consisting of barium cuprate, silica, bismuth oxide, mixtures thereof, and the like when the 1:2:3 material is being produced, although other oxides (and mixtures thereof) are also suitable.

The melt produced in melter 80 is then passed via line 82 to quencher 84, wherein it is formed into a glass. The glass is then passed via line 86 to grinder 88, wherein it is ground so that substantially all of its particles are less than about 50 microns (and, preferably, less than about 10 microns). This ground glass is then charged via line 89 to former 70, where it may be joined to either the superconductive material powder (charged via line 72) or the superconductive material bodies (charged via lines 66 or 68).

The intermediate 10 formed in former 70 is then passed via line 90 to heat treater 92.

In the first step of the heat treatment process, the material is preferably raised from ambient temperature to a temperature in excess of 900 degrees Centigrade at a rate of from about 1 to about 10 degrees Centigrade per minute; in one embodiment, the heating rate is from about 4 to about 7 degrees Centigrade per minute. It is even more preferred to use a heating rate of from about 2 to about 5 degrees Centigrade per minute.

Alternatively, one may preheat the furnace to the desired temperature and charge the intermediate 10 thereto. Regardless of which method is used, the intermediate 10 is then heated at a temperature of from about 900 to about 1,200 degrees Centigrade for from about 10 to about 720 minutes. When the superconductive layer 12 has been formed from quenched glass, it is preferred to use a heating time of from about 10 to about 30 minutes. When the superconductive layer 12 has been formed from sintered material, or powder material, then it is preferred to use a heating time of at least about 2 hours.

Heating is preferably conducted until grain texturing of the body (see FIG. 12) occurs throughout the bulk of the superconductor material. Samples can periodically be withdrawn from former 92 vial line 94 to laboratory 96 and evaluated to determine the extent of grain texturing.

As is known to those skilled in the art, the extent of grain texturing of a sample may be determined by convention optical microscopy means.

Thus, by way of illustration, in laboratory 96 the sample may be examined by an optical microscope such as, e.g., the "Versamet-2 Metallograph," which is manufactured by the Unitron Instruments, Inc. of 175 Express Street, Plainview, N.Y. Alternatively, or additionally, the sample may be examined by a scanning electron microscope such as, e.g., the ETEC "Autoscan" scanning electron microscope which is sold by the ETEC Corporation of 3392 Investment Boulevard, Hayward, Calif.

As is known to those skilled in the art, when a sample is to be analyzed by optical miscroscopy, it is preferred to first prepare the sample. Thus, e.g., one preferably should first section the sample and thereafter polish it. Additionally, when the sample is to be examined in the scanning electron microscope, it is preferred to section the sample, polish the sample, and deposit a conductive thin film coating onto it. The deposition may be done, e.g., in a "MiniCoater" (manufactured by Film-Vac Inc. of Englewood, N.J.) to deposit a gold or gold-palladium coating upon the sample.

Referring again to FIG. 4, after a body has been formed with the desired grain texturing, then the sample is cooled to a temperature from about 400 to about 600 degrees Centigrade at a rate of from about 1 to about 10 degrees Centigrade per minute. It is preferred to cool the body at a rate of from about 1 to about 10 degrees per minute.

In one preferred embodiment, the sample is heated at a temperature in excess of 1,000 degrees Centigrade until at least some of it has been melted, then it is cooled to a temperature of from about 990 to about 960 degrees Centigrade at a rate of from about 10 to about 20 degrees Centigrade per minute, then it is cooled to a temperature of from between 800 to about 930 degrees Centigrade at a rate of from about 1 to about 10 degrees per hour, and then it is cooled to a temperature of from about 400 to about 600 degrees Centigrade.

In another preferred embodiment, the sample is raised from ambient to a temperature in excess of 900 degrees Centigrade at a rate of from about 1 to about 3 degrees Centigrade per minute, then it is held at this temperature for from about 2 to about 12 hours, and then it is cooled to from about 400 to about 600 degrees Centigrade at the rate specified above.

It is preferred, when the sample is being heated to a temperature in excess of 900 degrees Centigrade, that it be contacted with an oxygen-containing gas such as, e.g., oxygen, air, and the like. In one embodiment, oxygen is preferred, and the oxygen is flowed over the sample at a rate of from about 0.5 to about 5 liters per minute.

When the heated sample is cooled to a temperature of from about 400 to about 600 degrees Centigrade, it is also preferred to contact the material with the oxygen-containing gas. In this part of the process, pure oxygen is preferred to be used, and it is flowed over the sample at a rate of at least about 0.5 liters per minute.

Once the sample has been cooled to the temperature of from about 400 to about 600 degrees Centigrade, it may thereafter be cooled to ambient at a rate of from about 1 to about 10 degrees Centigrade per minute. The rate used in this cooling step may be the same, or be different, than the rate used in the step in which the sample is first cooled to a temperature of from about 400 to about 600 degrees Centigrade. During this latter cooling step, it is also preferred to contact the sample with the oxygen-containing gas, pure oxygen being preferred.

The cooled sample from heat-treater 92 may then be passed via line 98 to finisher 100, wherein the sample may be subjected to standard finishing operations. Thus the sample may be ground and polished, etc. As is illustrated in FIGS. 2 and 3, it is preferred to grind off the oxide layer 14 to produce the finished bulk superconductor material 28. One may use conventional grinding means such as, e.g., a diamond grinding disk.

As will be apparent to those skilled in the art, one substantial advantage of applicants' process is that it can be used to produce complicated and relatively large superconductive shaped articles with excellent electrical properties. Thus, e.g., referring to FIGS. 5 through 10, one may produce a toroidal shaped object 102, a bar 104, a rod 106, a disk 108, a plate 110, and a thick film 112. It will be apparent to those skilled in the art that other relatively complex and/or large shapes can be produced by applicants' process.

Figure 11:
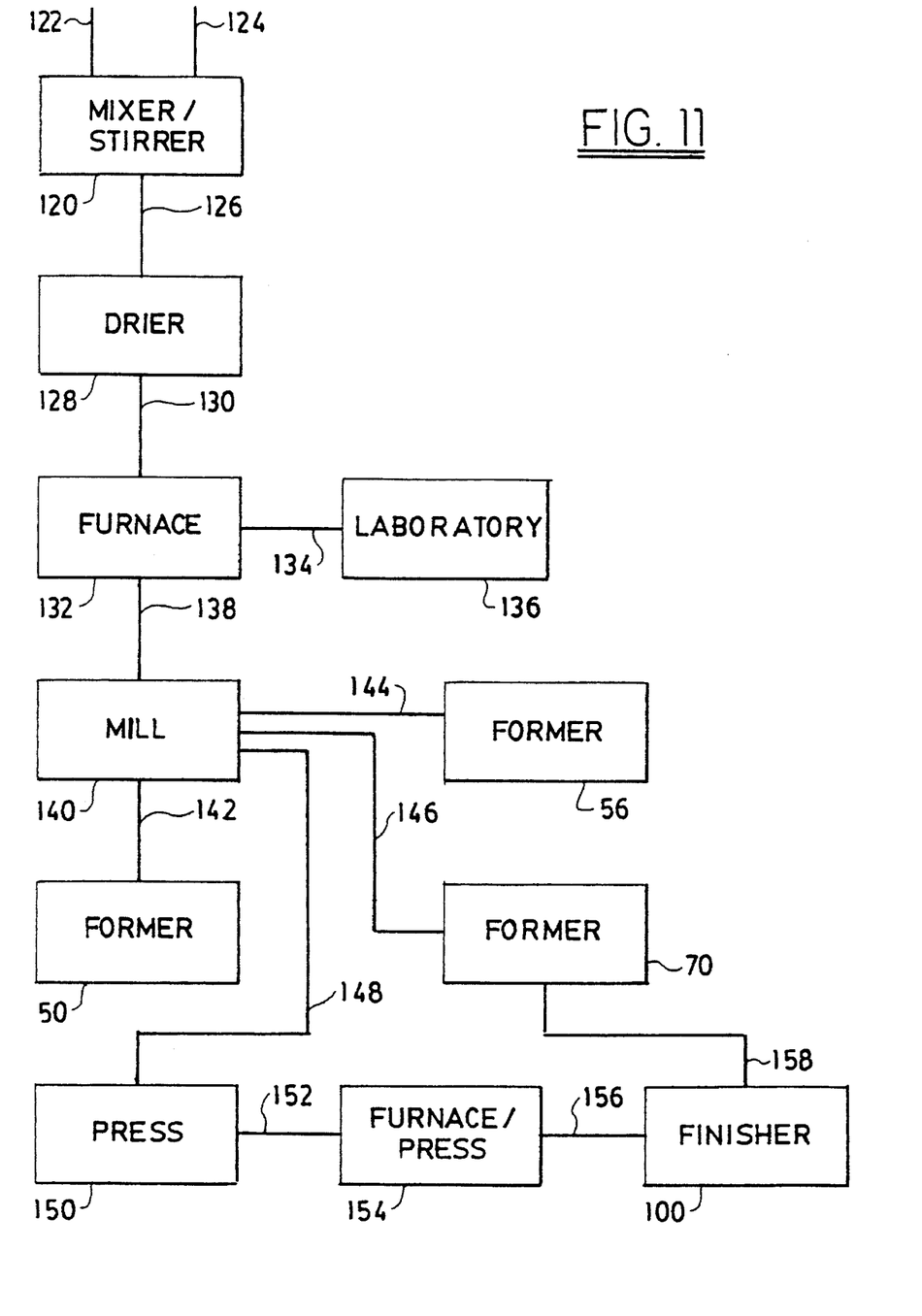
FIG. 11 is a flow diagram of another referred embodiment of applicants' invention.

FIG. 11 illustrates a process which may be used to prepare a starting material (layer 12) for use in the process of FIG. 4. The material produced in FIG. 11 may be charged via line 114 to former 70, wherein it may be combined with the oxide layer 14 as described before.

Referring to FIG. 11, to mixer/stirrer 120 is charged via line 122 a calcined superconductive powder, such as the calcined yttrium barium copper oxide reagent obtainable as catalog number 32,862-6 from the Aldrich Chemical Company.

A sol and subsequent gel may be produced in mixer/stirrer 120 by adding the necessary reagents via line 124. This sol may be prepared by the methods disclosed by S. R. Gurkovich and J. B. Blum in "Ultrastructure Processing of Glasses ....," edited by L. L. Hench et al. (John Wiley and Sons, New York, New York, 1984), at pages 152–160. Reference also may be had, e.g., to U.S. Pat. No. 4,921,328 (the disclosure of which is hereby incorporated by reference into this specification) a book by C. Jeffrey Brinker et al. entitled Sol Gel Science (Academic Press Inc., Boston, Mass., 1990), and an article by F. A. Selmi and V. R. W. Amarakoon, entitled "Sol-Gel Coating of Powders . . ." which was published in the Journal of the American Ceramic Society, 71[11], pages 934–937 (1988).

Metal alkoxide reagent may be added via line 124, together with a mixture of a solvent or cosolvent system. The metal alkoxide is generally of the formula $A(OR)_v$, wherein A is a metal ion, R is alkyl of from about 1 to about 18 carbon atoms, and v is the valence of metal A, being from about 1 to about 6.

The metal, A, may preferably be one or more of the cations described elsewhere in this specification, with reference to the metal oxide(s) used in layer 14. Thus, by way of illustration and not limitation, A may be bismuth, a mixture of copper and barium, silicon, titanium, niobium, mixtures thereof, etc.

Alternatively, or additionally, one may use a metal beta-diketonate and/or its allied derivative. These materials are defined and discussed in a book by R. C. Mehrotra et al. entitled "Metal beta-Diketonates and Allied Derivatives" (Academic Press, London, England, 1978).

In addition to the metal alkoxide, or the metal diketonate, one also may add solvent or cosolvent via line 124. Thus, e.g., one may choose a solvent which will function with the compounds of the A ions. Thus, e.g., one may use 2-methoxyethanol, ethanol, methanol, xylene, acetone, isopropanaol, xylene, toluene, benzene, hexane, and the like.

Generally, a sufficient amount of metal alkoxide solvent is charged so that the gel formed will constitute from about from about 0.01 to about 10 mole percent, by weight of total powder charged to the mixer/stirrer 120.

The gel thus formed coats the calcined superconductive material powder. The coated superconductive powder is then passed via line 126 to drier 128, where it is preferably dried at a temperature of from about 60 to about 200 degrees Centigrade until the mixture contains less than about 1.0 weight percent of residual solvent.

The dried mixture is then passed via line 130 to furnace 132, wherein it heated at a temperature of from about 400 to about 600 degrees Centigrade for from about 10 minutes to about 8 hours until substantially all of the organic material in the reaction mixture has been removed. Samples from furnace 132 may be periodically removed from furnace 132 via line 134 to laboratory 136 to determine to what extent, if any, carbonaceous material remains in the reaction mixture.

The pyrolyzed mixture from furnace 132 is then passed via line 138 to mill 140, wherein it is ground until substantially all of its particles are smaller than about 50 microns. Thereafter, the ground material is passed via line 142 to former 50 wherein, as is described elsewhere in this specification, the pyrolyzed powder may be formed into a green body.

Alternatively, the material from mill 140 may be passed via line 144 to former 56. Alternatively, the material from mill 140 may be charged via line 146 to former 70.

In another embodiment, the powder from mill 140 is passed via line 148 to press 150, wherein it may be formed into a green body by means similar to those described elsewhere in this specification. Thereafter, the green body from press 150 may be passed via line 152 to furnace 154, wherein it is simultaneously sintered and forged by a hot-forging process; see, e.g., Q. Robinson et al., "Sinter Forged $YBa_2Cu_3O_{7-x}$, Advanced Ceramic Materials, Volume 2, No. 3B, pages 380–387 (1987). In this process, the green body is heated to a temperature of from about 700 to about 1,100 degrees Centigrade while it is subjected to a pressure of from about 0.1 to about 5.0 megaPascals. It is preferred to conduct this hot-forging under an oxygen-containing atmosphere for from about 1 to about 12 hours.

In one embodiment, substrate plates are used to compress the green body during the hot forging. These substrate plates are substantially inert to the green body during the sintering reaction. Thus, e.g., one may use magnesia plates, platinum foil, and the like for the substrate plates.

During the hot forging process, the thickness of the green body is reduced by a factor of at least 2.0; as used in this specification, the term thickness refers to the distance between the substrate plates occupied by the green body. That is, if the initial thickness is divided by the thickness of the sintered body, such ratio is at least 2.0.

The sintered and compressed green body may then be passed via line 156 to finisher 100, wherein it may be sectioned, ground, and/or polished. The finished sections may then be charged to former 70 via line 158, wherein it may be combined with layer 14 as described elsewhere in this specification.

Figure 12:
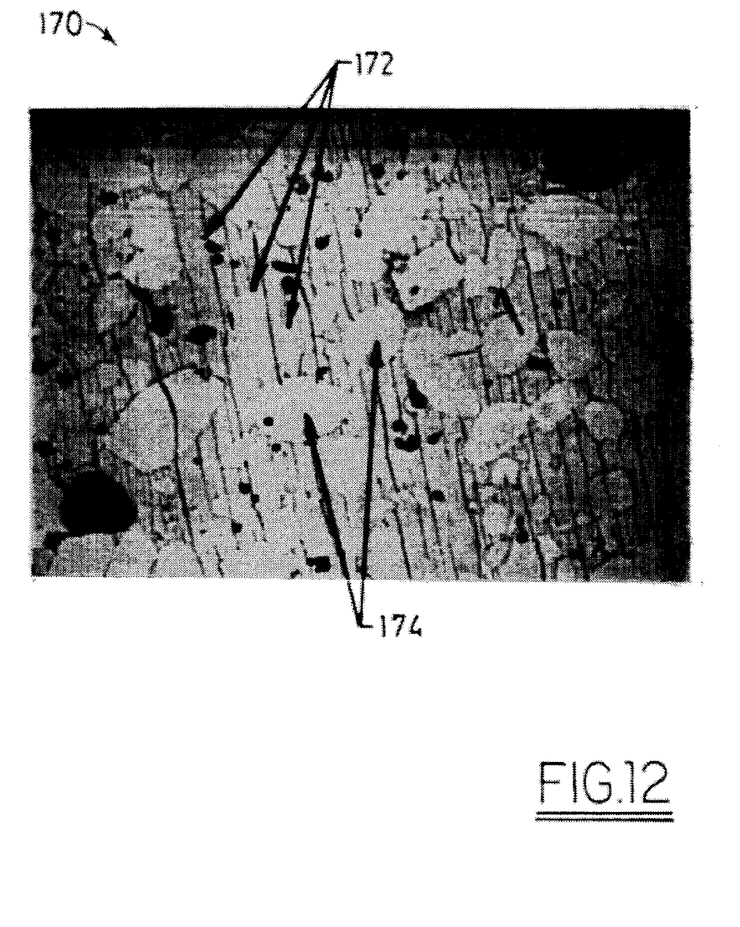
FIG. 12 is a copy of a photomicrograph of the textured cross-section of a body made by the process of FIG. 11.

FIG. 12 is a xerographic copy of a scanning electron micrograph, with a magnification of 1000x, of a section of a 1:2:3 bulk superconductor made by the process of applicants' invention. Referring to FIG. 12, it will be seen that section 170 exhibits oriented grains 172 forming domains. These domains are highly aligned, indicative of a highly textured superconductive material.

The presence of a secondary phase is also noticeable from FIG. 12; see, e.g., particulates 174. These particulates indicate the presence of a $Y_2BaCuO_5$ phase, also known of the 2:1:1 embodiment, which often accompanies the development of texturing in the 1:2:3 material.

The grains 172, which are aligned substantially in the A-B plane, are believed to allow one to achieve relatively high critical current values in that plane.

Referring to FIG. 1, it will be seen that diffusion couple 10 contains at least two layers, such as layers 12 and 14. In one embodiment, not shown, diffusion couple 10 contains at least three layers. In another embodiment, illustrated in FIG. 13, diffusion couple 10 contains at least four layers.

Figure 13:
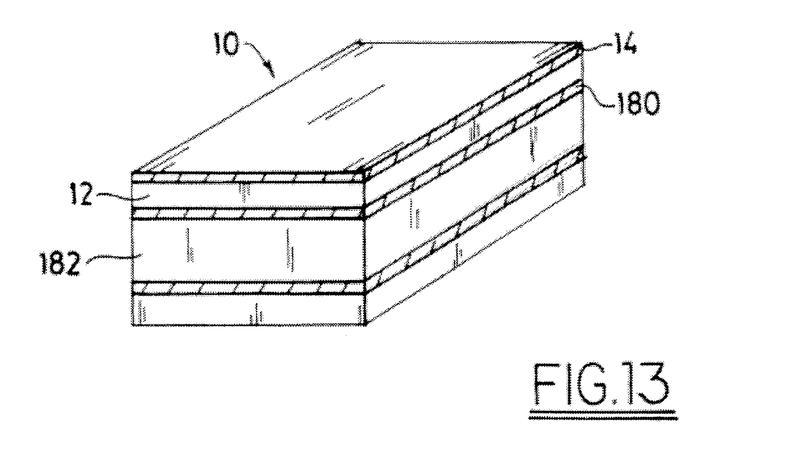
FIG. 13 is a sectional view of laminated superconductive structure made by the process of this invention.

Referring to FIG. 13, it will be seen that diffusion couple 10 is comprised of a layer of oxide and/or metal and/or salt material 14, a layer of superconductive material 12, a second layer 180 of oxide and/or metal and/or salt material, and a second layer 182 of superconductive material. As will be apparent to those skilled in the art, laminated structures similar to that illustrated in FIG. 13 can be made with more or fewer layers.

The laminated structure of FIG. 13 may be made by conventional means. Thus, e.g., after the two-layer structure of FIG. 1 has been produced by the method described, an additional oxide layer may be coated onto surface 184 of superconductive layer 12 either before or after sintering. Alternatively, or additionally, an additional superconductive layer may be connectged to surface 186 of oxide layer 14 either before or after sintering. These additional layers may be attached to the original layers by any of the means suitable for attaching the original layers to each other.

The following examples are presented to illustrate the claimed invention but are not to be deemed limitative thereof. Unless otherwise specified, all parts are by weight, and all temperatures are in degrees Centigrade.

EXAMPLE 1

Preparation of a 1:2:3 yttrium/barium/copper powder 30.66 grams of barium acetate (catalog number 25,591-2. Aldrich Chemical Company 1990–1991 catalog), 20.30 grams of yttrium acetate (Unocal Molycorp reagent number 5655), and 35.96 grams of copper acetate (Aldrich catalog number 22,9601) were mixed with 400 milliliters of distilled water in a glass beaker. The reaction mixture was then heated to 65 degrees Centigrade for 60 minutes and continuously stirred with a Teflon stir bar.

124.42 grams of polyacrylic acid solution (product number Good-Rite K-732, obtained from the B.F. Goodrich Company of Cleveland, Ohio) was titrated with 70 volume percent of ammonium hydroxide until the pH of the mixture was 8.0. Thereafter, this solution was stirred for 30 minutes.

The aqueous solution containing the barium, yttrium, and copper cations was cooled to a temperature of 45 degrees Centigrade, and it was then added to the polyacrylic acid solution; and the mixture was then stirred until complete gelation (chelation) occurred, as evidenced by the total disappearance of the setting water; this occurred after about 4 minutes of mixing.

The gel thus produced was then placed into a glass tray, and the tray/gel assembly was placed into a preheated Thermolyne Mechanical Oven (model number OV35245, manufactured by the Barnstead/Thermolyne Corporation of 2555 Kerper Blvd., Dubuque, Iowa) at a temperature of 80 degrees Centigrade. The gel was dried at this temperature for 48 hours until it contained less than about 5 weight percent of water.

The dried material was then charged to a porcelain mortar and pestle and hand ground until substantially all of its particles were smaller than 50 microns.

The ground particles were then placed into a Lindberg furnace (type 51442, manufactured by the Lindberg Corporation of 304 Hart Street, Watertown, Wis.). The temperature of the furnace was increased from ambient to 200 degrees Centigrade at a rate 100 degrees Centigrade per hour; the furnace was maintained at 200 degrees Centigrade for 2 hours; the temperature of the furnace was then raised to 600 degrees Centigrade at a rate of 100 degrees Centigrade per hour; the furnace was maintained at 600 degrees Centigrade for 5.0 hours; the temperature of the furnace was then lowered to ambient at a rate of 150 degrees Centigrade per hour. During this heating cycle, the sample was disposed within a high density magnesia crucible and contacted with air flowing at a rate of 2.0 liters per minute.

The sample was then charged to a mortar and pestle and hand-ground until substantially all of its particles were smaller than 50 microns. The ground powder was then placed onto a high-density magnesia tray to form a substantially uniform layer of powder which was about 0.25 inches thick, and the tray/powder assembly was then placed into the aforementioned Lindberg furnace.

The temperature of the furnace was raised from ambient to 850 degrees Centigrade at a rate of 100 degrees Centigrade per hour. Thereafter, the furnace was maintained at 850 degrees Centigrade for 24 hours. Thereafter, the furnace was cooled to ambient temperature at a rate of 200 degrees Centigrade per hour. During this entire heat treatment cycle, the sample was contacted with oxygen flowing at a rate of 1.5 liters per minute. The calcined powder produced in this step contained less than 0.1 weight percent of carbon.

The calcined powder was then ground in an agate mortar and pestle until substantially all of its particles were smaller than 50 microns.

1.0 gram of the calcined powder was then charged to a stainless steel die with a 10 millimeter diameter. Thereafter the powder was compressed with a Carver Laboratory Press, model M, using a pressure of 130 megaPascals, to a pressed depth of about 3.0 millimeters.

The pellet was then placed onto a zirconia setter with a layer of calcined 1:2:3 powder between the setter and the sample; the layer of the calcined powder was about 0.125 inches. The setter/powder/pellet assembly was then charged to a Lemont type KZ-2 furnace (manufactured by Lemont Scientific Company of State College, Pa.); a 2.25" alumina tube was used. The temperature of the furnace was raised from ambient to 950 degrees Centigrade at a rate of 1.7 degrees per minute; thereafter, the furnace was maintained at 950 degrees Centigrade for 2.0 hours; thereafter the furnace was cooled at a rate of 1.7 degrees per minute to a temperature of 570 degrees Centigrade; thereafter the furnace was maintained at 570 degrees Centigrade for 6 hours; and thereafter the furnace was cooled to ambient at a rate of 3.4 degrees Centigrade per minute. During this heat treatment, the pellet was contacted with oxygen flowing at a rate of 1 liter per minute.

EXAMPLE 2

Preparation of a bulk superconductor 2.0 grams of bismuth oxide (Aldrich catalog number 22,389-1) were mixed 3 milliliters of reagent grade ethanol and agitated until a substantially homogeneous slurry was formed.

The slurry was then uniformly coated over the top surface of the pellet of Example 1.

The coated pellet was then placed onto a zirconia setter, and the setter/pellet assembly was placed into the aforementioned Thermolyne oven, which had been preheated to a temperature of 60 degrees Centigrade. The assembly was heated in this oven, under ambient conditions, for 30 minutes.

The dried assembly was then weighed. It was found that the dry assembly had an additional weight which was 0.7 grams per gram of the original pellet greater than the weight of the uncoated pellet of Example 1.

The coated pellet was then placed onto a zirconia setter with a layer of calcined 1:2:3 powder between the setter and the sample; the layer of the calcined powder was about 0.125 inches. The setter/powder/pellet assembly was then charged to a Lemont type KZ-2 furnace; a 2.25" alumina tube was used. The temperature of the furnace was raised from ambient to 980 degrees Centigrade at a rate of 2 degrees per minute; thereafter, the furnace was maintained at 980 degrees Centigrade for 2.0 hours; thereafter the furnace was cooled at a rate of 2 degrees per minute to ambient temperature. During this heat treatment, the pellet was contacted with air flowing at a rate of 1 liter per minute.

EXAMPLE 3

Preparation of Textured Superconductive Materials from Glass Precursor.

The procedure of Example 1 was substantially followed to produce the calcined powder containing less than 0.1 weight percent of carbon referred to in such Example. 10 grams of this calcined powder were then placed in a platinum crucible, and the crucible was then inserted into a Lemont Type KZ box furnace which had been preheated to a temperature of 1,400 degrees Centigrade. The furnace was maintained at this temperature for 30 minutes, then the heated material was quickly removed from the furnace, poured out of the crucible, and quenched between cold copper plates, thereby forming a glass.

The glass was then charged into an agate mortar and pestle and ground until substantially all of its particles were smaller than 50 microns.

Barium cuprate was prepared by mixing 19.74 grams of barium carbonate (Aldrich catalog number 32,943-6) and 7.96 grams of copper oxide (Aldrich catalog number 32,545-7) until a substantially homogeneous mixture was obtained. The mixture was then charged into a laboratory ball mill and ground with 0.25" satellite stabilized zirconia media for 12 hours until substantially all of the particles in the mixture were smaller than 20 microns. Thereafter, the ground mixture was charged to an alumina crucible until it uniformly filled the bottom of such crucible to a depth of about 0.25 inches. The crucible was then charged to the aforementioned Lindberg furnace, and the temperature of the furnace was raised from ambient to 950 degrees Centigrade at a rate of 180 degrees per hour Thereafter, the material was heated at 950 degrees Centigrade for 8 hours; then it was cooled to ambient at a rate of 200 degrees Centigrade per hour. During this heat treatment, the sample was contacted with oxygen flowing at a rate of 1 liter per minute.

The heat treated powder was then charged to an agate mortar and pestle and ground until substantially all of its particles were less than 50 microns. The ground powder was then calcined again within the alumina crucible using exactly the same heat treatment cycle.

The calcined powder thus obtained was then charged to the agate mortar and pestle and ground until substantially all of its particles were smaller than 50 microns.

A steel die was used to prepare a green body. The die had a rectangular shape with a length of 1 inch and a width of 0.87 inches.

2.5 grams of the ground glass were then charged into the die to form a uniform layer. Thereafter, the ground glass was pressed with a load of 1,500 pounds for 30 seconds. Thereafter, the load was removed, and 1.5 grams of the calcined barium cuprate powder was charged into the die on top of the compressed glass powder. Thereafter, this composite structure was pressed with a load of 3,500 pounds for 2.0 minutes. The load was then removed. A composite bar was produced.

The composite bar as then placed onto a zirconia setter with a layer of calcined 1:2:3 powder between the setter and the sample; the layer of the calcined powder was about 0.125 inches. The setter/powder/bar assembly was then charged to a Lemont type KZ-2 furnace; a 2.25" alumina tube was used. The temperature of the furnace was raised from ambient to 1,100 degrees Centigrade at a rate of 6.67 degrees per minute; thereafter, the furnace was maintained at 1,100 degrees Centigrade for 20 minutes; thereafter the furnace was cooled to a temperature of 1,000 degrees Centigrade at a rate of 2.5 degrees Centigrade per minute; thereafter the furnace was maintained at 1,000 degrees Centigrade for 10 minutes; thereafter the furnace was cooled to 930 degrees Centigrade at a rate of 2 degrees Centigrade per hour; thereafter the furnace was cooled to 570 degrees Centigrade at a rate of 1.7 degrees Centigrade per minute; thereafter the furnace was held at 570 degrees Centigrade for 6 hours; and thereafter the furnace was cooled to ambient at a rate of 1.7 degrees Centigrade per minute. During this heat treatment, the material was contacted with oxygen flowing at a rate of 1 liter per minute.

A rectangular bar with dimensions of 1.5 millimeters thickness by 3.7 millimeters wide by 6.1 millimeters long was cut from the heat treated composite bar; the critical current of this rectangular bar was then determined under different conditions.

The critical current of the rectangular bar, at 77 degrees Kelvin and 10 Gauss, was determined in accordance with the surface impedance test described elsewhere in this specification. The critical current of the bar under these conditions was found to be in excess of 10,000 amperes per square centimeter and in excess of 1,000 amperes per square centimeter at 500 Gauss.

The critical current of the rectangular bar, at 77 degrees Kelvin and 100 Gauss, was determined using the well-known hysteresis magnetization technique referred to elsewhere in this specification. The superconducting quantum interference device used in this test is described in J. L. Mayo's "Superconductivity" (Tab Books, Inc., Blue Ridge Summit, Pa., 1988). The critical current of the rectangular bar under these test conditions was found to be 100,000 amperes per square centimeter.

The critical current of the rectangular bar at 77 degrees Kelvin at 10,000 Gauss was also evaluated; the critical current of the rectangular bar under these test conditions was found to be about 2,000 amperes per square centimeters.

EXAMPLE 4

To a 50 milliliter glass beaker was charged 0.134 cubic centimeters of tetraethylorthosilicate (catalog number 0-4617, Fisher Scientific Company, Fair Lawn, N.J.), 0.11 grams of distilled water, and 1,267 cubic centimeters of reagent grade acetone (Aldrich catalog number 17,912-4). The beaker was covered, and the mixture was mixed for one hour using a Teflon-coated magnetic stirrer.

To the beaker was then charged an additional 10 cubic centimeters of acetone and 15.0 grams of the calcined powder which contained less than 0.1 percent of carbon produced by the procedure of Example 1. The mixture was then stirred for 30 minutes using the Teflon-coated magnetic stirrer.

The mixture then was charged to a laboratory ball mill equipped with 0.25" stabilized zirconia media; 14 milliliters of additional acetone were then added. Milling occurred for 12 hours.

The coated powder thus obtained was then passed through a 325 mesh sieve, and the particles which passed through this sieve (less than 50 microns in size) were then charged into the aforementioned Thermolyne oven which had been preheated to 60 degrees Centigrade; the material was allowed to dry in such oven for 6 hours.

The material was then charged to an agate mortar and pestle and ground until substantially all of its particles were smaller than 50 microns.

2.5 grams of the powder was then charged to a stainless steel die with a diameter of 10 millimeters. It was pressed with a load of 2,500 pounds for 2.0 minutes, and then it was removed from the die.

The pellet thus formed was then inserted into a hot forging unit; platinum foil substrates were inserted between the pellet and the rams of the hot forging unit. The pellet was pressed with an initial load of 0.1 megaPascals while its temperature was increased from ambient to 900 degrees Centigrade at a rate of 6 degrees per minute. After the 900 degree Centigrade temperature had been reached, the pellet was maintained at this temperature for 30 minutes, while the same load was applied to it. Thereafter, the pellet was maintained at the same 900 degree Centigrade temperature, while the load was increased to 0.3 megaPascals (and held there for 60 minutes), and then increased to 0.825 mega-Pascals (and held there for 60 minutes), and then increased to 2.2 megaPascals (and held there for 120 minutes). Then the load was released, and the furnace was allowed to furnace cool over a period of about 5 hours.

The cooled hot forged material had a thickness which was about 0.33 times as great as the original thickness of the pellet. The pellet surfaces which had been exposed to the platinum foil were sanded to remove the reaction layer. The sanded pellet was then sectioned to produce a rectangular bar with cross-sectional dimensions of about 2 millimeters by about 3 millimeters.

2.0 grams of bismuth oxide (Aldrich catalog number 22,389-1) were mixed 3 milliliters of reagent grade ethanol and agitated until a substantially homogeneous slurry was formed. The slurry was then uniformly coated over the top surface of the rectangular bar.

The coated bar was then placed onto a zirconia setter, and the setter/bar assembly was placed into the aforementioned Thermolyne oven, which had been preheated to a temperature of 60 degrees Centigrade. The assembly was heated in this oven, under ambient conditions, for 30 minutes.

The dried assembly was then weighed. It was found that the dry assembly had an additional weight which was 0.7 grams per gram of the original pellet greater than the weight of the uncoated bar.

The coated bar was then placed onto a zirconia setter with a layer of calcined 1:2:3 powder between the setter and the sample; the layer of the calcined powder was about 0.125 inches. The setter/powder/bar assembly was then charged to a Lemont type KZ-2 furnace; a 2.25" alumina tube was used. The temperature of the furnace was raised from ambient to 980 degrees Centigrade at a rate of 2 degrees per minute; there after, the furnace was maintained at 980 degrees Centigrade for 12.0 hours; thereafter the furnace was cooled at a rate of 2 degrees per minute to ambient temperature. During this heat treatment, the pellet was contacted with air flowing at a rate of 1 liter per minute.

It is to be understood that the aforementioned description is illustrative only and that changes can be made in the apparatus, the ingredients and their proportions, and in the sequence of combinations and process steps as well as in other aspects of the invention discussed herein, without departing from the scope of the invention defined in the following claims.

We claim:

1. A process for preparing a bulk superconductive material, comprising the steps of:
    (a) providing a diffusion couple comprised of a first layer and a second layer integrally connected to each other, wherein:
        i. said second layer is comprised of at least about 50 weight percent of material with a stoichiometry represented by a formula selected from the group consisting of
        $(R_{1-z}M_z)(Ba_{2-y}M'_y)Cu_3O_{6+x}$,
        $(R_{1-z}M_z)(Ba_{2-y}M'_y)Cu_4O_8$,
        $(AO)_m M''_2 Ca_{n-1} Cu_n O_{2n+2}$, and mixtures thereof, wherein:
            (a) x is from about 0.5 to 1.0,
            (b) R is selected from the group consisting of yttrium, gadolinium, lanthanum, europium, holmium, dysprosium, scandium, neodymium, thulium, samarium, ytterbium, lutetium, praseodymium, and mixtures thereof,
            (c) M and M' are independently selected from the group consisting of barium, strontium, calcium, yttrium, gadolinium, lanthanum, europium, holmium, dysprosium, scandium, neodymium, thulium, samarium, ytterbium, lutetium, praseodymium, and mixtures thereof, (d) z is from about 0 to about 0.5, and y is from about 0 to about 0.4,
            (e) A is selected from the group consisting of thallium, bismuth, lead, mixtures of thallium and lead, and mixtures of bismuth and lead,
            (f) m is from about 1 to about 3,
            (g) M" is selected from the group consisting of barium, strontium, and mixtures thereof, and
            (h) n is at least 1;
        ii. said first layer is comprised of at least 50 weight percent of a compound selected from the group consisting of bismuth oxide, antimony oxide, arsenic oxide, phosphorous oxide, silicon oxide, tin oxide, copper oxide, boron oxide, indium oxide, thallium oxide, gallium oxide, alumina, yttrium oxide, lanthanum oxide, scandium oxide, praesodymium oxide, neodymium oxide, samarium oxide, europium oxide, gadolinium oxide, terbium oxide, dysprosium oxide, holmium oxide, erbium oxide, ytterbium oxide, lutetium oxide, titanium oxide, zirconium oxide, hafnium oxide, niobium oxide, barium cuprate, barium oxide, strontium oxide, calcium oxide, magnesium oxide, beryllium oxide, and mixtures thereof,
        iii. when said diffusion couple is heated to a temperature of least about 800 degrees Centigrade for at least about 10 minutes, said second layer has a shrinkage which is greater than the shrinkage of said first layer;
    (b) raising the temperature of said diffusion couple from ambient temperature to a temperature at least about 1,000 degrees Centigrade at a rate of from about from about 4 to about 7 degrees Centigrade per minute;
    (c) thereafter heating said diffusion couple at said temperature of at least about 1,000 degrees Centigrade for from about 10 to about 120 minutes while contacting said diffusion couple with an oxygen-containing gas flowing over said diffusion couple at a rate of from about 0.5 to about 5.0 liters per minute;
    (d) thereafter cooling said diffusion couple from said temperature of at least about 1,000 degrees Centigrade to a temperature of about 930 degrees Centigrade at a rate of from about 1 to about 10 degrees per hour while contacting said diffusion couple with an oxygen-containing gas flowing over said diffusion couple at a rate of from about 0.5 to about 5.0 liters per minute.

2. The process as recited in claim 1, wherein said second layer is at least about 70 weight percent glass.

3. The process as recited in claim 2, wherein said second layer consists essentially of material with a stoichiometry represented by the formula $(R_{1-z}M_z)(Ba_{2-y}Ca_y)Cu_3O_{6+x}$.

4. The process as recited in claim 1, wherein R is yttrium.

5. The process as recited in claim 4, wherein said first layer consists essentially of one metal oxide.

6. The process as recited in claim 5, wherein said metal oxide is selected from the group consisting of bismuth oxide, barium cuprate, yttrium oxide, niobium oxide, titanium oxide, and praesodymium oxide.

7. The process as recited in claim 6, wherein said metal oxide is in the form of a glass.

8. The process as recited in claim 6, wherein at least 95 weight percent of said second layer of said diffusion couple is comprised of glass.

9. The process as recited in claim 1, wherein the material in said second layer of said diffusion couple is comprised of coated particles.

10. The process as recited in claim 1, wherein said first layer and said second layer are integrally connected to each other by means of sol gel processing.

11. The process as recited in claim 1, wherein said second layer is comprised of from about 0.1 to about 30 weight percent of a particulate flux pinning agent substantially all of whose particles are smaller than about 10 microns.

* * * * *